(12) United States Patent
De Amicis et al.

(10) Patent No.: US 11,127,776 B2
(45) Date of Patent: Sep. 21, 2021

(54) HYBRID BONDING METHOD FOR SEMICONDUCTOR WAFERS AND RELATED THREE-DIMENSIONAL INTEGRATED DEVICE

(71) Applicant: LFOUNDRY S.R.L., Avezzano (IT)

(72) Inventors: Giovanni De Amicis, L'Aquila (IT); Andrea Del Monte, Pomezia (IT); Onorato Di Cola, Barete (IT)

(73) Assignee: LFOUNDRY S.R.L., Avezzano (IT)

( * ) Notice: Subject to any disclaimer, the term of this patent is extended or adjusted under 35 U.S.C. 154(b) by 0 days.

(21) Appl. No.: 16/612,662

(22) PCT Filed: May 17, 2018

(86) PCT No.: PCT/IB2018/053472
§ 371 (c)(1),
(2) Date: Nov. 11, 2019

(87) PCT Pub. No.: WO2018/211447
PCT Pub. Date: Nov. 22, 2018

(65) Prior Publication Data
US 2020/0212086 A1   Jul. 2, 2020

(30) Foreign Application Priority Data

May 18, 2017   (IT) .................. 102017000053902

(51) Int. Cl.
*H01L 27/146* (2006.01)
*H01L 25/065* (2006.01)
(Continued)

(52) U.S. Cl.
CPC ........ *H01L 27/1469* (2013.01); *H01L 21/187* (2013.01); *H01L 24/08* (2013.01);
(Continued)

(58) Field of Classification Search
CPC . H01L 2224/80895; H01L 2224/80896; H01L 2224/83895; H01L 2224/83896;
(Continued)

(56) References Cited

U.S. PATENT DOCUMENTS 6,080,640 A * 6/2000 Gardner .............. H01L 23/5329
                                                           438/455
6,559,543 B1 * 5/2003 Dunham ............ H01L 23/5329
                                                           257/758

(Continued)

OTHER PUBLICATIONS

International Search Report and Written Opinion for Corresponding International Application No. PCT/IB2018/053472, (15 Pages) (dated Aug. 28, 2018).

*Primary Examiner* — Sonya McCall-Shepard
(74) *Attorney, Agent, or Firm* — Lucas & Mercanti, LLP

(57) ABSTRACT

A method to perform hybrid bonding of two semiconductor wafers without using a dedicated tool for thermo-compression is disclosed. According to the herein disclosed technique, the semiconductor wafers to be bonded together may be placed in an oven simply staying one upon the other without applying any additional compression between them besides their own weight. This outstanding result has been attained using of a particular type of thermosetting materials, namely siloxane polymers of the type that shrink when cured. Among these siloxane polymers, the siloxane polymers of the type SC-480, siloxane polymers of the series SC-200, SC-300, SC-400, SC-500, SC-700, SC-800 and mixtures thereof are particularly suitable.

6 Claims, 2 Drawing Sheets

(51) Int. Cl.
*H01L 25/00* (2006.01)
*H01L 21/18* (2006.01)
*H01L 23/00* (2006.01)

(52) U.S. Cl.
CPC .......... *H01L 24/80* (2013.01); *H01L 25/0657* (2013.01); *H01L 25/50* (2013.01); *H01L 27/14634* (2013.01); *H01L 2224/08145* (2013.01); *H01L 2224/80011* (2013.01); *H01L 2224/80895* (2013.01); *H01L 2224/80896* (2013.01)

(58) Field of Classification Search
CPC ........... H01L 27/1469; H01L 27/14634; H01L 21/187; H01L 24/05; H01L 24/08; H01L 24/94; H01L 27/14632; H01L 2224/08145
See application file for complete search history.

(56) References Cited

U.S. PATENT DOCUMENTS

| | | | |
|---|---|---|---|
| 2002/0074670 A1 | 6/2002 | Suga | |
| 2005/0236695 A1* | 10/2005 | Ghoshal | C09D 183/06 257/642 |
| 2005/0255711 A1* | 11/2005 | Sugawara | H01L 21/31604 438/785 |
| 2007/0207592 A1 | 9/2007 | Lu et al. | |
| 2015/0021785 A1 | 1/2015 | Lin et al. | |
| 2015/0294963 A1 | 10/2015 | Lin | |
| 2016/0190103 A1 | 6/2016 | Kabe et al. | |
| 2017/0062366 A1 | 3/2017 | Enquist | |

\* cited by examiner

HYBRID BONDING METHOD FOR SEMICONDUCTOR WAFERS AND RELATED THREE-DIMENSIONAL INTEGRATED DEVICE

CROSS-REFERENCE TO RELATED APPLICATIONS

This application is a 371 of PCT/IB2018/053472, filed May 17, 2018, which claims the benefit of Italian Patent Application No. 102017000053902, filed May 18, 2017.

TECHNICAL FIELD

This disclosure relates to bonding between semiconductor wafers and more particularly to a hybrid bonding method for bonding two semiconductor wafers and a related three dimensional integrated device, in particular an integrated optical sensor.

BACKGROUND

Wafer bonding techniques are increasingly important for realizing three-dimensional IC structures. In wafer bonding, two semiconductor wafers are bonded together to form a three dimensional stack. In applications where two different wafer types are needed, this approach can provide a single device with both functional devices in one package.

In one particular application, CMOS image sensors, a substrate including an array of image sensors may be bonded to a circuit wafer so as to provide a 3D IC system that includes all of the circuitry needed to implement an image sensor in the same board area as the array of sensors, providing a complete image sensing solution in a single packaged integrated circuit device.

Wafer bonding techniques for stacking two semiconductor wafers typically comprises two methods: pure dielectric or metallic bonding, and hybrid bonding. Pure dielectric bonding guarantees mechanical stability simply by the fact the thin die or wafer is bonded over its entire surface. This method, however, limits the options for electrical interconnection to a via-last approach. In the case of metallic bonding, electrical interconnection is the prime function of the bond, but the mechanical stabilization of thin die requires introduction of dummy metallization also in areas where no electrical interconnects are required.

Compared to the previous technique, hybrid wafer bonding approach using metal/dielectric patterned layers involves combining metal bonding for direct electrical interconnections and dielectric bonding for mechanical bonding strength. Two main approaches have been patented so far, one using Metal embedded in $SiO_2$ and Metal embedded in Polymer layer:
1. Metal/$SiO_2$ (Ziptronix Direct Bond Interconnect method);
2. Metal/Polymer (BCB) (Metal/Adhesive Via first 3D bonding).

Hybrid wafer bonding methods are well known in the art. The documents:
US2007/0207592;
US2015/0294963;
US2002/0074670;
US 2017/0062366;
the article "*Adhesive Wafer Bonding Using Partially Cured Benzocyclobutene for Three-Dimensional Integration*", by Frank Niklaus et al., J. Electrochem. Soc. 2006 volume 153, issue 4, G291-G295;
the chapter "*Hybrid Metal/Polymer Wafer Bonding Platform*", by Jian-Qiang Lu, J. Jay McMahon, and Ronald J. Gutmann, published in the book "*Handbook of Wafer Bonding*", First Edition, Edited by Peter Ramm, (2012) Wiley-VCH Verlag GmbH & Co. KGaA;

provide tutorial disclosures of common techniques for realizing hybrid bonding between two semiconductor wafers.

According to these techniques, an adhesive layer of benzocyclobutene (BCB) or of another thermosetting polymer resin is deposited on a respective wafer of two semiconductor wafers to be bonded together. The semiconductor wafers are stacked so as to place at least portions of the adhesive layers one against the other; while the wafers are under a compressive load, the adhesive layers are cured to make them well adhere one to the other.

These known techniques are quite onerous because they require the use of a dedicated tool for thermo-compression, which is practically considered mandatory in present hybrid bonding techniques, in order to make the adhesive layers stick together so as to interconnect the two wafers.

The patent publication US2015/0021785 discloses a semiconductor device structure that includes a first semiconductor wafer and a second semiconductor wafer bonded via a hybrid bonding structure, wherein the hybrid bonding structure includes a first conductive material embedded in a first polymer material and a second conductive material embedded in a second polymer material.

The document US2016/190103 discloses a semiconductor device having a first substrate and a second substrate bonded with each other with a first surface layer and a second surface layer facing each other. The first surface layer and the second surface layer comprise a film of Silicon oxide and exposed metal contacts. The surface layers are treated with oxygen plasma to terminate dangling bonds with hydroxyl groups, then the metal contacts are aligned and brought into direct contact with each other.

The two substrates are firmly kept one against the other, for example by pressing one against the other or by firmly tying one onto the other acting on the free surface layers opposite to said first surface layer and said second surface layer, so as to contrast the forces that are generated because of thermal expansion, then the two superposed substrates are placed in an oven one firmly kept one against the other. When subjected to a heat treatment, the facing metal contacts of the first surface layer and of the second surface layer are pressure-bonded because of their relatively great coefficient of thermal expansion and because the two substrates are firmly kept one against the other. As a consequence, a strong connection between facing metal contacts of the two substrates is attained.

Therefore, the method disclosed in this prior document can be performed only if a dedicated tool for compressing the two substrates, of for keeping them one against the other for contrasting expansion forces due to thermal expansion, is available.

SUMMARY

Extensive studies and tests carried out by the applicant have shown that it is possible to perform hybrid bonding without using a dedicated tool for thermo-compression. According to the herein disclosed technique, the semiconductor wafers to be bonded together may be placed in an oven simply staying one upon the other without applying any additional compression between them besides their own weight.

This outstanding result has been attained thanks to the use of a particular type of thermosetting materials, namely siloxane polymers of the type that shrink when cured. Among these siloxane polymers, the siloxane polymers of the type SC-480, siloxane polymers of the series SC-200, SC-300, SC-400, SC-500, SC-700, SC-800 made by Silecs Oy (now acquired by Pibond Oy) and mixtures thereof are particularly adapted for being used in the herein disclosed method of hybrid bonding of two semiconductor wafers.

A hybrid bonding method, that may be carried out without compressing together the semiconductor wafers to be bonded while a thermosetting is being performed, is defined in the annexed claim 1.

More in detail, this disclosure provides a hybrid bonding method for bonding together two semiconductor wafers, each semiconductor wafer having a plurality of mutually spaced conductive pads exposed on a top surface of the wafer and defining recesses therebetween, the method comprising the steps of:

a1) depositing on a first semiconductor wafer of said semiconductor wafers, a coating layer of siloxane polymer not yet cured in a conformal manner over the top surface of said first semiconductor wafer and over its conductive pads so as to bury its conductive pads and to fill the recessed between them, said siloxane polymer being of a type that shrinks when cured;

a2) realizing a second semiconductor wafer of said semiconducting wafers with exposed conductive pads and with a coating layer of either silicon oxide or of said siloxane polymer not yet cured over the top surface of said second semiconductor wafer and in the recesses between the conductive pads;

b) reducing thickness of the layer of said siloxane polymer not yet cured of said first semiconductor wafer by removing a topmost portion thereof with a chemical mechanical polishing technique, so as to expose its conductive pads and to planarize them together with the recessed filled with said siloxane polymer not yet cured;

c) coupling the two semiconductor wafers aligned between them one facing the other so as to place in abutment conductive pads of the two semiconductor wafers one against the other and to place in abutment one against the other said recesses filled with said siloxane polymer not yet cured and/or with silicon oxide;

d) baking the two semiconductor wafers together one coupled to the other in an oven at a temperature and for a time sufficient to cure at a same time the portions of said siloxane polymer and to make the portions of said siloxane polymer stick together or with said portions of silicon oxide.

According to an embodiment of the hybrid bonding method, the step a2) is carried out by depositing on said second semiconductor wafer of said semiconducting wafers, a coating layer of said siloxane polymer not yet cured in a conformal manner over the top surface of said second semiconductor wafer and over its conductive pads so as to bury its conductive pads and to fill the recesses between them, then by reducing thickness of the layer of said siloxane polymer not yet cured of said second semiconductor wafer by removing a topmost portion thereof with a chemical mechanical polishing technique, so as to expose its conductive pads and to planarize them together with the recessed filled with said siloxane polymer not yet cured.

According to another embodiment of the hybrid bonding method, the step a2) is carried out by depositing, on said second semiconductor wafer of said semiconducting wafers, a coating layer of silicon oxide, digging holes in said coating layer and filling them with metal to realize said conductive pads.

Three-dimensional integrated devices, in particular 3D image sensors, fabricated using the disclosed method for hybrid bonding semiconductor wafers, are also disclosed.

The claims as filed are integral part of this specification and are herein incorporated by reference.

BRIEF DESCRIPTION OF THE DRAWINGS

FIGS. from 1a to 1d illustrate steps of a hybrid bonding method of two semiconductor wafers using a siloxane polymer on both wafers.

FIGS. from 2a to 2d illustrate steps of a hybrid bonding method of two semiconductor wafers using a siloxane polymer on the device wafer and $SiO_2$ on the carrier wafer.

DETAILED DESCRIPTION

Figure 1A:
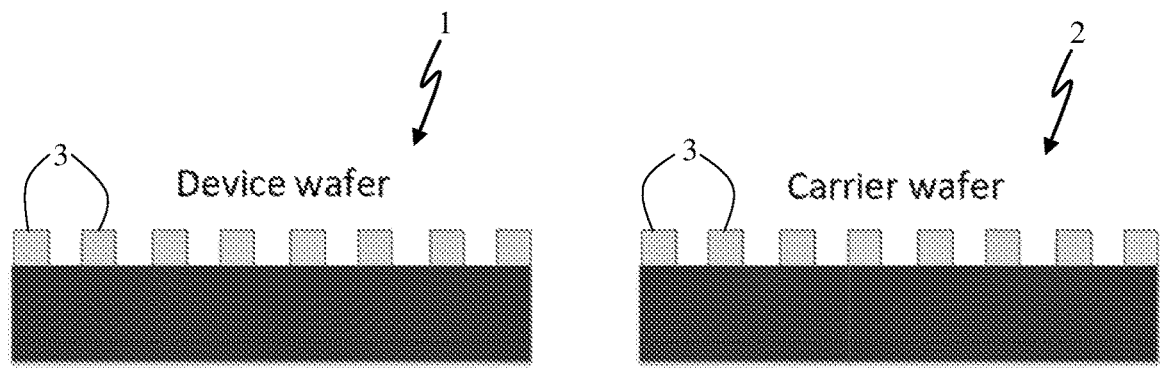
Figure 1B:
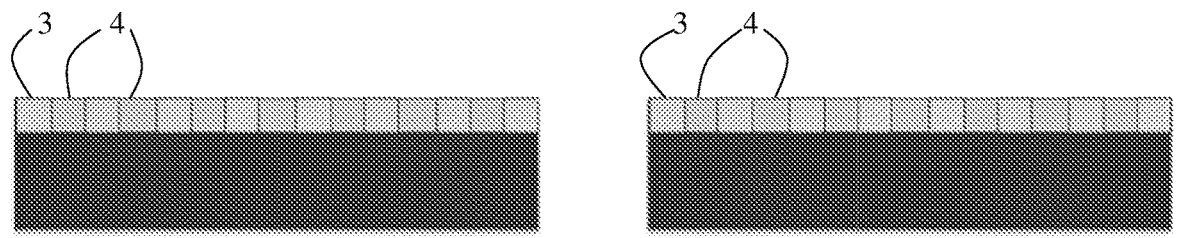
Figures 1C, 1D:
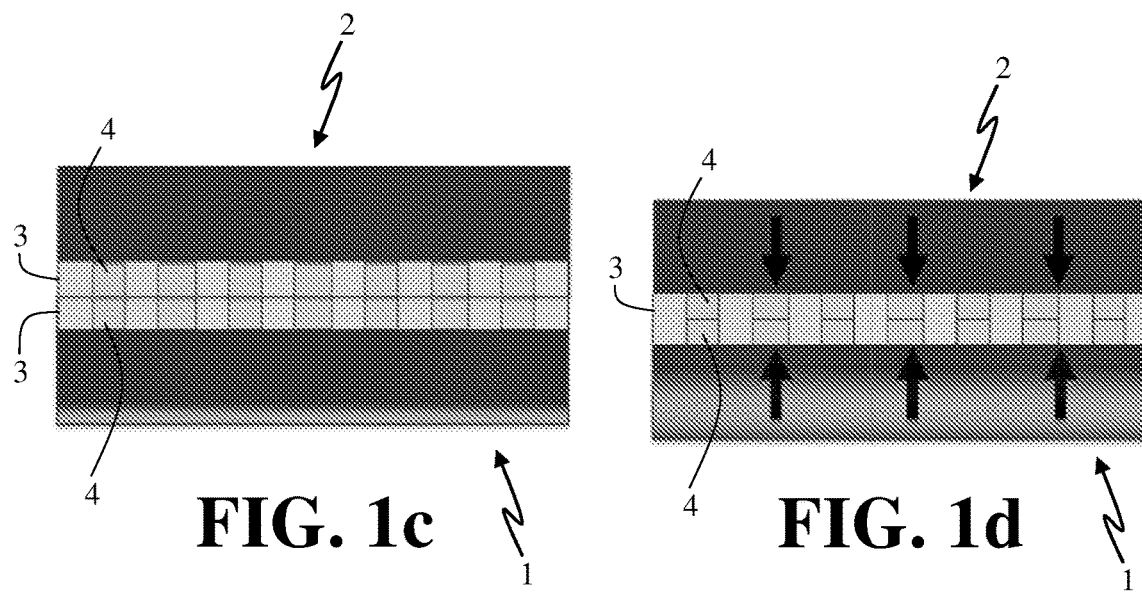
Figure 2A:
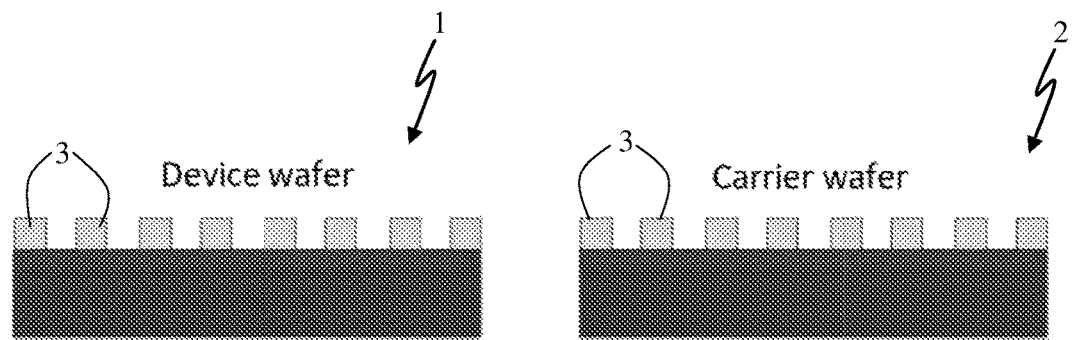
Figure 2B:
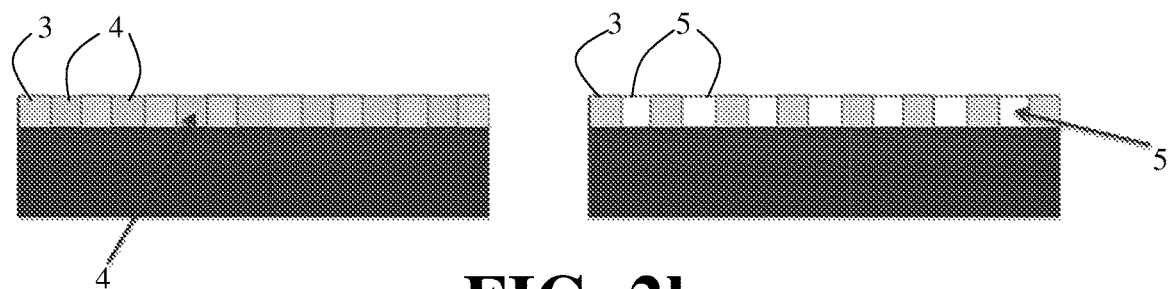
Figures 2C, 2D:
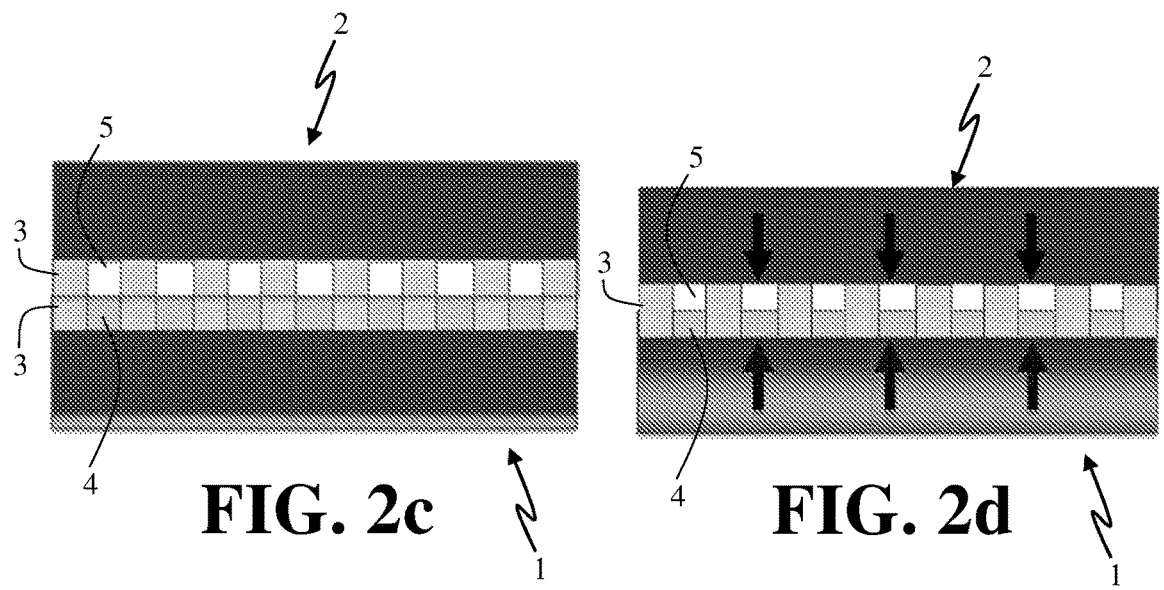

The steps of a method of hybrid bonding two semiconductor wafers are illustrated in the annexed figures. FIGS. from 1a to 1d refer to a hybrid bonding carried out using on the substrate of both wafers a siloxane polymer of the type that shrinks when cured. FIGS. 2a to 2d are similar to FIGS. 1a to 1d but they refer to hybrid bonding carried out using the siloxane polymer on a first wafer (the device wafer, in the shown example) and silicon oxide ($SiO_2$) of the other wafer (the carrier wafer, in the shown example).

Differently from what is commonly considered unescapable in the art, it is possible to perform a hybrid bonding of two wafers without keeping the wafers compressed one against the other while a thermosetting step is being carried out.

The applicant has found that this result cannot be attained using BCB, which is by far the most widespread adhesive for hybrid bonding, and thus it is necessary to use a different adhesive. Among the numerous possible choices, the applicant has noticed that siloxane polymers undergo a spontaneous shrinking when cured, and thus they could be used in the proposed method. For example the siloxane polymers belonging to the series identified by the following alphanumeric commercial names:

SC-480;
SC-200;
SC-300;
SC-400;
SC-500;
SC-700;
SC-800;
mixtures of the above series of siloxane polymers;

all made by Silecs Oy (Finland), now acquired by Pibond Oy (http://pibond.com/en, http://pibond.com/en/products/product-lines/sc) have been proven to be particularly adapted. These siloxane polymers have been tested and it has been found that portions of them filling the gaps between adjacent electrical contacts of a first semiconductor wafer stick well to facing siloxane polymer portions or $SiO_2$ portions of a second semiconductor wafer even if no additional compression force is exerted during the thermosetting step. They shrink when cured and this leads to the possibility of validly using them in the present hybrid bonding process of two semiconductor wafers.

Among the siloxane polymers cited above, the siloxane polymers of the series SC-300, SC-400, SC-700 and SC-800 showed good performances. Without being bound to any theory, the better results obtained with the above mentioned preferred series of siloxane polymers may be due to the relevant shrinking of the polymers when cured.

Outstanding performances have been obtained using a siloxane polymer of the type SC-480.

As may be noticed in the enclosed figures and is common in the art, hybrid bonding is carried out by filling (FIGS. 1a and 1b, FIGS. 2a and 2b) spaces among metal contacts 3 of two matching semiconductor wafers, namely a device wafer 1 and a carrier wafer 2 to be bonded one upon the other, with an adhesive 4. Typically, this is done by depositing in a conformal manner a layer of siloxane polymer on a first wafer 1 and a layer of siloxane polymer 4, or of silicon oxide ($SiO_2$) 5, on the other wafer 2 so as to bury the electrical contacts 3, then by reducing thickness of the deposited layers so as to uncover the electrical contacts 3 (i.e. the conductive pads) and to planarize the free surfaces.

According to another embodiment, the layer of silicon oxide ($SiO_2$) 5 is first deposited onto the top surface of the second wafer 2, then holes are dug into it. Into these holes a metal is deposited to fill them, at least partially, to realize the conductive pads 3 that are exposed on the top surface of the second wafer 2.

Through an alignment step, the two wafers 1 and 2 are superposed one another (FIG. 1c, FIG. 2c) aligning their contacts 3 so as to ensure electrical continuity.

It is worth noticing that the siloxane polymer 4 is not yet cured when the two semiconductor wafers 2 and 3 are placed into the oven.

In prior hybrid bonding methods that employ BCB, it is necessary to compress the two wafers one against the other and to cure the adhesive while keeping them compressed, in order to keep the electrical contacts 3 pressed against one another and have the smallest possible contact resistance between any pair of matched contacts. For this reason, in prior methods it is necessary to use a purposely designed thermo-compression tool.

By contrast, with the method of this disclosure, a thermocompression tool is no longer required because, when cured, abutted portions of siloxane polymer 4 stick to each other or to portions of silicon oxide ($SiO_2$) 5 (FIG. 1d, FIG. 2d) and spontaneously undergo to a shrinkage. Thanks to this shrinkage, a traction force draws the semiconductor wafers 1, 2 one against the other abutting corresponding metal contacts 3 that, during the thermal treatment for curing the polymer, become in practice a single piece. Therefore, the two wafers are firmly kept together by the retraction force of the cured siloxane polymer 4, establishing an excellent electrical continuity between the facing electrical contacts 3.

Tests carried out by the applicant have shown that siloxane polymers of the type SC-480 and of the series SC-200, SC-300, SC-400, SC-500, SC-700, SC-800 and mixtures thereof stick well to each other when cured and also to $SiO_2$. Moreover, facing portions of these materials, cured for bonding two semiconductor wafers, withstand the relevant traction forces that are generated when cured without cracking.

Conveniently, before placing the two wafers one against the other before the final thermo-setting step, the free surfaces of the wafers 1, 2 are planarized with a well-known Chemical Mechanical Polishing (CMP) step, in order to enhance matching of the electrical contacts.

In order to improve the adhesion of the siloxane polymer to the wafer substrate, a wet clean process using $H_2O_2+NH_3$ dried with IPA (isopropyl alcohol) may be executed before depositing in a conformal manner the layer of siloxane polymer.

Using the hybrid bonding method of this disclosure it is possible to realize three-dimensional integrated devices, in particular 3D image sensors, with less process steps than in prior art fabrication processes.

Preferably, the portions of siloxane polymer 4 are cured by baking the two semiconductor wafers one coupled to the other in an oven at a temperature ranging from 300° C. to 400° C. for about 60 minutes.

Optionally, after having planarized the free surfaces of the wafers with a CMP step (FIG. 1b, FIG. 2b), it is possible to carry out a preliminary baking step for partially curing the portions of siloxane polymer on one or both semiconductor wafers at a temperature ranging between 100° C. and 200° C. for 2 minutes, before superposing the two wafers one against the other and carrying out the final baking step.

The invention claimed is:

1. A hybrid bonding method for bonding together two semiconductor wafers, each semiconductor wafer having a plurality of mutually spaced conductive pads exposed on a top surface of the wafer and defining recesses therebetween, the method comprising the steps of:
   a1) depositing on a first semiconductor wafer of said semiconductor wafers, a coating layer of siloxane polymer not yet cured in a conformal manner over the top surface of said first semiconductor wafer and over its conductive pads so as to bury its conductive pads and to fill the recesses between them, said siloxane polymer being of a type that shrinks when cured;
   a2) realizing a second semiconductor wafer of said semiconducting wafers with exposed conductive pads and with a coating layer of either silicon oxide or of said siloxane polymer not yet cured over the top surface of said second semiconductor wafer and in the recesses between the conductive pads;
   b) reducing thickness of the layer of said siloxane polymer not yet cured of said first semiconductor wafer by removing a topmost portion thereof with a chemical mechanical polishing technique, so as to expose its conductive pads and to planarize them together with the recessed filled with said siloxane polymer not yet cured;
   c) coupling the two semiconductor wafers aligned between them one facing the other so as to place in abutment conductive pads of the two semiconductor wafers one against the other and to place in abutment one against the other said recesses filled with portions of said siloxane polymer not yet cured and/or with portions of said silicon oxide;
   d) placing the two semiconductor wafers together one coupled to the other in an oven with said siloxane polymer not yet cured, and baking the two semiconductor wafers together one coupled to the other at a temperature and for a time sufficient to cure at a same time the portions of said siloxane polymer and, at a same time, to make the portions of said siloxane polymer stick together or with said portions of silicon oxide;
   wherein said siloxane polymer is selected from the group consisting of siloxane polymers of the type SC-480, siloxane polymers of the series SC-200, siloxane polymers of the series SC-300, siloxane polymers of the series SC-400, siloxane polymers of the series SC-500, siloxane polymers of the series SC-700, siloxane polymers of the series SC-800 and mixtures thereof.

2. The hybrid bonding method of claim 1, wherein said step a2) is carried out by depositing on said second semiconductor wafer of said semiconducting wafers, a coating layer of said siloxane polymer not yet cured in a conformal manner over the top surface of said second semiconductor wafer and over its conductive pads so as to bury its conductive pads and to fill the recesses between them, then by reducing thickness of the layer of said siloxane polymer not yet cured of said second semiconductor wafer by removing a topmost portion thereof with a chemical mechanical polishing technique, so as to expose its conductive pads and to planarize them together with the recesses filled with said siloxane polymer not yet cured.

3. The hybrid bonding method of claim 1, wherein said step a2) is carried out by depositing, on said second semiconductor wafer of said semiconducting wafers, a coating layer of silicon oxide, digging holes in said coating layer and filling them with metal to realize said conductive pads.

4. The hybrid bonding method of claim 1, comprising the step of preliminarily cleaning said top surfaces of the two semiconductor wafers with a wet cleaning process using $H_2O_2$ and $NH_3$, then drying said top surfaces with isopropyl alcohol before carrying out the steps a1) and a2).

5. The hybrid bonding method of claim 1, wherein said step d) is carried out at a temperature ranging from 300° C. to 400° C.

6. The hybrid bonding method of claim 1, comprising executing the following operation after step b) and before step c):

baking the semiconductor wafers, at a temperature ranging between 100° C. and 200° C. for 2 minutes, wherein said siloxane polymer is of the type SC-480 polymer.

\* \* \* \* \*